United States Patent
Shatalov et al.

(10) Patent No.: US 9,911,900 B2
(45) Date of Patent: *Mar. 6, 2018

(54) DEVICE INCLUDING TRANSPARENT LAYER WITH PROFILED SURFACE FOR IMPROVED EXTRACTION

(71) Applicant: Sensor Electronic Technology, Inc., Columbia, SC (US)

(72) Inventors: Maxim S. Shatalov, Columbia, SC (US); Alexander Dobrinsky, Loudonville, NY (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/149,782

(22) Filed: May 9, 2016

(65) Prior Publication Data
US 2017/0062657 A1 Mar. 2, 2017

Related U.S. Application Data

(63) Continuation of application No. 14/297,656, filed on Jun. 6, 2014, now Pat. No. 9,337,387, which is a (Continued)

(51) Int. Cl.
*H01L 33/22* (2010.01)
*H01L 33/20* (2010.01)
(Continued)

(52) U.S. Cl.
CPC .............. *H01L 33/22* (2013.01); *F21V 5/002* (2013.01); *G06F 17/5009* (2013.01);
(Continued)

(58) Field of Classification Search
CPC ....... H01L 33/22; H01L 33/10; H01L 33/007; H01L 33/20; H01L 2933/0058;
(Continued)

(56) References Cited

U.S. PATENT DOCUMENTS 4,497,974 A   2/1985 Deckman et al.
5,779,924 A   7/1998 Krames et al.
(Continued)

FOREIGN PATENT DOCUMENTS

JP   2003197963 A   7/2003
JP   2009242130 A   10/2009
(Continued)

OTHER PUBLICATIONS

Abouelsaood, A., "Modeling light scattering from mesoporous silicon," Journal of Applied Physics, Mar. 1, 2002, 8 pages, vol. 91, No. 5

(Continued)

*Primary Examiner* — Michael Carter
*Assistant Examiner* — Mohammed R Alam
(74) *Attorney, Agent, or Firm* — LaBatt, LLC

(57) ABSTRACT

A profiled surface for improving the propagation of radiation through an interface is provided. The profiled surface includes a set of large roughness components providing a first variation of the profiled surface having a characteristic scale approximately an order of magnitude larger than a target wavelength of the radiation. The set of large roughness components can include a series of truncated shapes. The profiled surface also includes a set of small roughness components superimposed on the set of large roughness components and providing a second variation of the profiled surface having a characteristic scale on the order of the target wavelength of the radiation.

20 Claims, 10 Drawing Sheets

Related U.S. Application Data continuation-in-part of application No. 13/517,711, filed on Jun. 14, 2012, now Pat. No. 9,142,741.

(60) Provisional application No. 61/497,489, filed on Jun. 15, 2011.

(51) Int. Cl.

| | | |
|---|---|---|
| *G06F 17/50* | (2006.01) | |
| *F21V 5/00* | (2018.01) | |
| *H01L 33/00* | (2010.01) | |
| *H01L 33/10* | (2010.01) | |

(52) U.S. Cl.
CPC ........ *G06F 17/5045* (2013.01); *H01L 33/007* (2013.01); *H01L 33/10* (2013.01); *H01L 33/20* (2013.01); *H01L 2933/0058* (2013.01); *H01L 2933/0083* (2013.01); *Y10T 29/49* (2015.01)

(58) Field of Classification Search
CPC ............. H01L 2933/0083; F21V 5/002; G06F 17/5009; G06F 17/5045; Y10T 29/49
See application file for complete search history.

(56) References Cited

U.S. PATENT DOCUMENTS

| | | | |
|---|---|---|---|
| 6,441,403 B1 | 8/2002 | Chang et al. | |
| 6,649,939 B1* | 11/2003 | Wirth | H01L 33/20 |
| | | | 257/744 |
| 6,657,236 B1 | 12/2003 | Thibeault et al. | |
| 6,791,119 B2 | 9/2004 | Slater, Jr. et al. | |
| 7,211,831 B2 | 5/2007 | Erchak et al. | |
| 7,335,920 B2 | 2/2008 | Denbaars et al. | |
| 7,355,210 B2 | 4/2008 | Ou et al. | |
| 7,473,936 B2 | 1/2009 | Tran et al. | |
| 7,524,686 B2 | 4/2009 | Chu et al. | |
| 7,629,195 B2 | 12/2009 | Tran et al. | |
| 7,704,763 B2 | 4/2010 | Fujii et al. | |
| 7,897,420 B2 | 3/2011 | Chu et al. | |
| 7,932,106 B2 | 4/2011 | Li | |
| 8,114,698 B2 | 2/2012 | Zhong et al. | |
| 9,048,378 B2 | 6/2015 | Shatalov et al. | |
| 9,142,741 B2 | 9/2015 | Shatalov et al. | |
| 2002/0123164 A1 | 9/2002 | Slater, Jr. et al. | |
| 2003/0132445 A1 | 7/2003 | Yoshitake et al. | |
| 2004/0012958 A1 | 1/2004 | Hashimoto et al. | |
| 2005/0221521 A1 | 10/2005 | Lee et al. | |
| 2006/0091412 A1 | 5/2006 | Wheatley et al. | |
| 2006/0186424 A1 | 8/2006 | Fujimoto et al. | |
| 2006/0204865 A1* | 9/2006 | Erchak | H01L 33/20 |
| | | | 430/7 |
| 2006/0270074 A1* | 11/2006 | Kim | B82Y 20/00 |
| | | | 438/22 |
| 2007/0018187 A1 | 1/2007 | Lee et al. | |
| 2007/0108459 A1 | 5/2007 | Lu | |
| 2007/0134834 A1 | 6/2007 | Lee et al. | |
| 2008/0012034 A1 | 1/2008 | Thielen et al. | |
| 2008/0277686 A1 | 11/2008 | Tsai | |
| 2009/0159871 A1 | 6/2009 | Lee et al. | |
| 2009/0159907 A1 | 6/2009 | Wang | |
| 2009/0166666 A1 | 7/2009 | Yao et al. | |
| 2009/0242913 A1 | 10/2009 | Kim et al. | |
| 2009/0302429 A1 | 12/2009 | Plossl et al. | |
| 2009/0315055 A1 | 12/2009 | Tamboli et al. | |
| 2009/0323330 A1* | 12/2009 | Gordin | F21V 5/04 |
| | | | 362/235 |
| 2010/0019263 A1 | 1/2010 | Yeh et al. | |
| 2010/0038664 A1 | 2/2010 | Strauss | |
| 2010/0117070 A1* | 5/2010 | Adekore | H01L 21/0237 |
| | | | 257/43 |
| 2010/0136728 A1 | 6/2010 | Horng et al. | |
| 2010/0283065 A1 | 11/2010 | Yen | |
| 2011/0024783 A1 | 2/2011 | Horng et al. | |
| 2011/0215290 A1 | 9/2011 | Choi et al. | |
| 2014/0312373 A1* | 10/2014 | Donofrio | H01L 33/20 |
| | | | 257/98 |
| 2015/0228855 A1 | 8/2015 | Shatalov et al. | |
| 2016/0049551 A1 | 2/2016 | Shatalov et al. | |

FOREIGN PATENT DOCUMENTS

| | | |
|---|---|---|
| JP | 2010129596 | 6/2010 |
| KR | 100661602 | 12/2006 |
| KR | 1020080006207 A | 1/2008 |
| WO | 2006096767 A1 | 9/2006 |

OTHER PUBLICATIONS

Chen, et al., "Improvement in Light Extraction Efficiency of High Brightness InGaN-Based Light Emitting Diodes," Proc. of SPIE, 2009, 10 pages, vol. 7216.

Fujii, et al., "Increase in the extraction efficiency of GaN-based light-emitting diodes via surface roughening," Applied Physics Letters, Feb. 9, 2004, 4 pgs, vol. 84, No. 6.

Ghannam, et al., "A semiquantitative model of a porous silicon layer used as a light diffuser in a thin film solar cell," Solar Energy Materials & Solar Cells 60, 2000, 21 pages.

Huh, et al., "Improved light-output and electrical performance of InGaN-based light-emitting diode by microroughening of the p-GaN surface," Journal of Applied Physics, Jun. 1, 2003, 4 pages., vol. 93, No. 11.

Ishiguro, et al., "Solar Light Absorption Property of Sputtered Al—N Films with Enhanced Surface Roughness during film Growth," Jpn. Journal of Applied Physics, Jan. 2002, 9 pages, vol. 41, No. 1.

Kawato, et al., "Multiple scattering of light in porous glass," Physical Review B, Jan. 1, 1994, 5 pages, vol. 49, No. 1.

Papa, et al., "Investigation of surface roughness on etched glass surfaces," Thin Solid Films, 2011, 4 pages.

Ritchie, et al., "Applications of thin graded-index films to solar absorbers," Applied Optics, May 1977, 6 pages, vol. 16, No. 5.

Striemer, et al., "Dynamic etching of silicon for broadband antireflection applications," Applied Physics Letters, Oct. 14, 2002, 3 pages, vol. 81, No. 1.

Windisch, et al., "Light-Extraction Mechanisms in High-Efficiency Surface-Textured Light-Emitting Diodes," IEEE Journal on Selected Topics in Quantum Electronics, Mar./Apr. 2002, 8 pages, vol. 8, No. 2.

Yamada, et al., "InGaN-Based Near-Ultraviolet and Blue-Light-Emitting Diodes with High External Quantum Efficiency Using a Patterned Sapphire Substrate and a Mesh Electrode," Jpn. Journal of Applied Physics, Dec. 15, 2002, 3 pages, vol. 41.

Alam, M., U.S. Appl. No. 13/517,711, Notice of Allowance, dated May 22, 2015, 29 pages.

Alam, M., U.S. Appl. No. 13/517,711, Notice of Allowance, dated Feb. 2, 2015, 30 pages.

Alam, M., U.S. Appl. No. 13/517,711, Final Office Action 1, dated Jul. 9, 2014, 22 pages.

Alam, M., U.S. Appl. No. 13/517,711, Office Action 1, dated Dec. 17, 2013, 34 pages.

Alam, M., U.S. Appl. No. 14/297,656, Notice of Allowance, dated Jan. 11, 2016, 16 pages.

Alam, M., U.S. Appl. No. 14/297,656, Office Action 1, dated Jul. 20, 2015, 43 pages.

Miyoshi, J., U.S. Appl. No. 13/52,350, Notice of Allowance, dated Jan. 27, 2015, 12 pages.

Miyoshi, J., U.S. Appl. No. 13/524350, Notice of Allowance, dated Oct. 24, 2014, 10 pages.

Miyoshi, J., U.S. Appl. No. 13/524,350, Office Action 1, dated Jul. 1, 2014, 18 pages.

Office Action for Taiwan Application No. 101121634 with English translation of search report and machine translation of office action, 18 pages, dated Oct. 30, 2014.

Adams, R., Application No. EP 12799758, Supplementary European Search Report, dated Sep. 30, 2014, 8 pages.

(56) References Cited

OTHER PUBLICATIONS

Adams, R., Application No. EP 12801261, Supplementary European Search Report, dated Oct. 2, 2014, 10 pages.
Kim, K., International Application No. PCT/US2012/042555, International Search Report and Written Opinion, dated Jan. 17, 2013, 9 pages.
Park H., International Application No. PCT/US2012/042646, International Search Report and Written Opinion, dated Dec. 27, 2012, 9 pages.
Miyoshi, J., U.S. Appl. No. 14/728,435, Non-Final Rejection, dated Sep. 28, 2016, 34 pages.
Miyoshi, J., U.S. Appl. No. 14/728435, Final Rejection, dated Feb. 9, 2017, 10 pages.
Miyoshi, J., U.S. Appl. No. 14/728435, Notice of Allowance, dated Apr. 20, 2017, 8 pages.

* cited by examiner

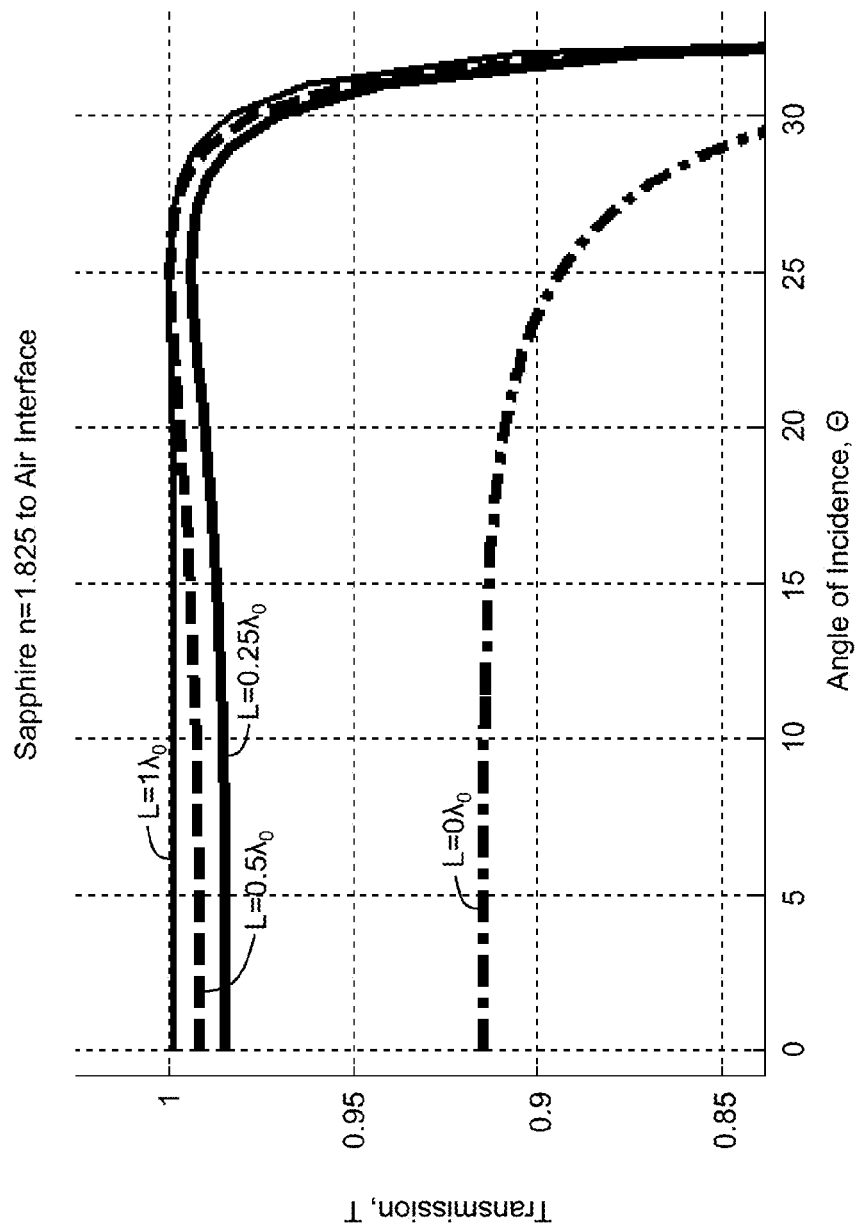

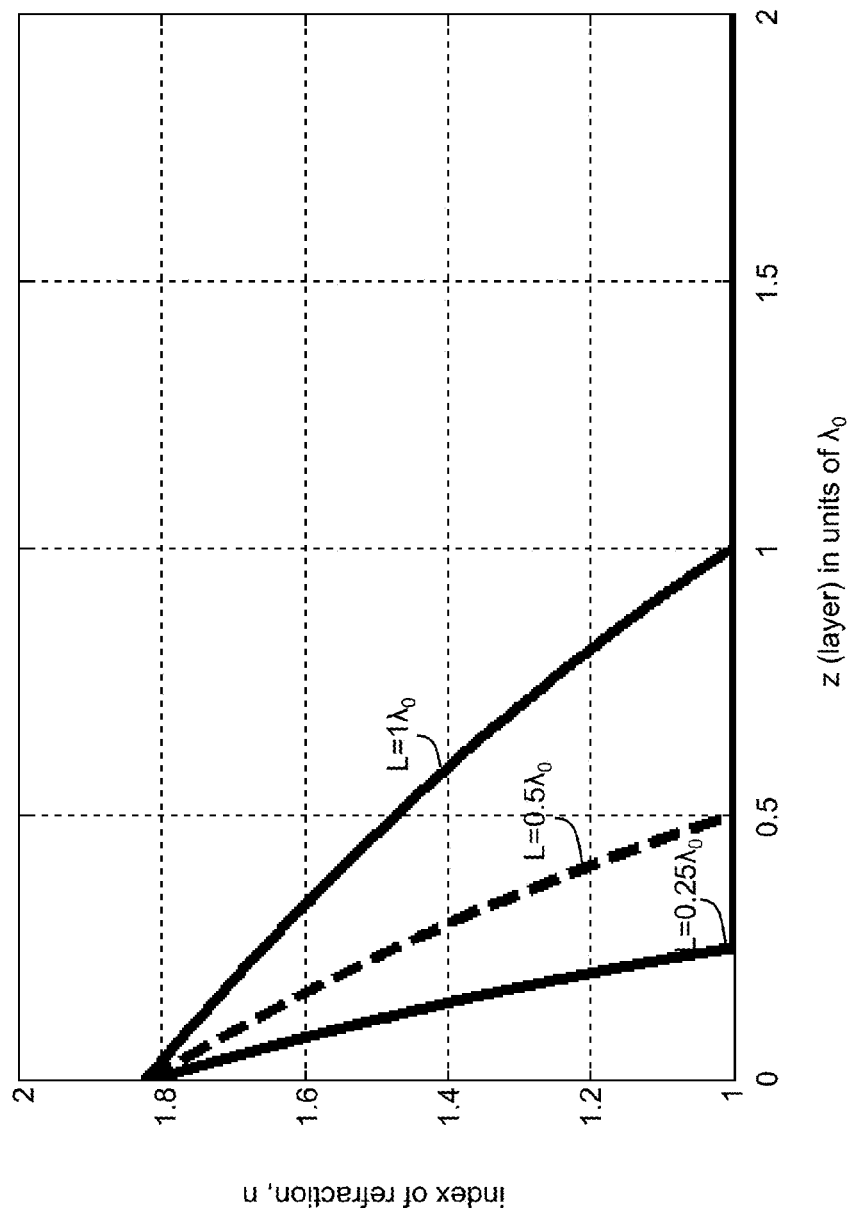

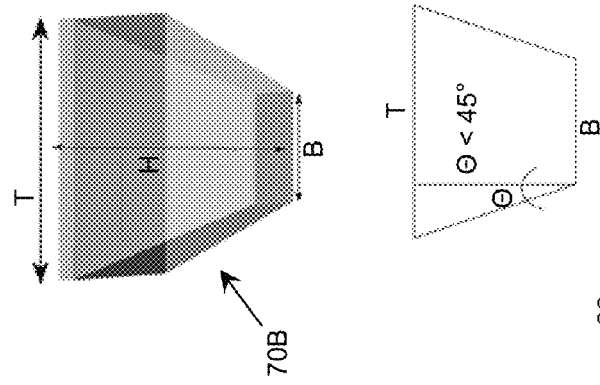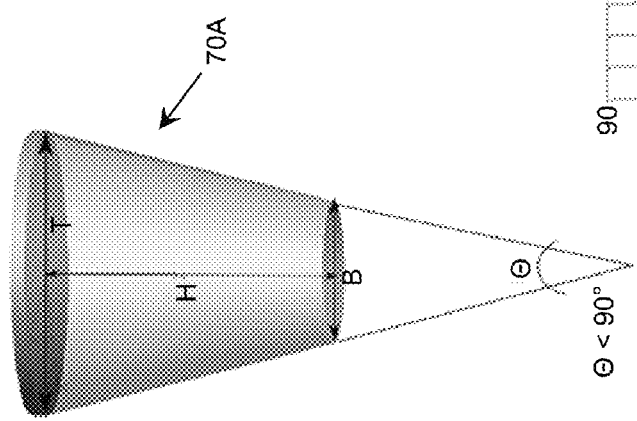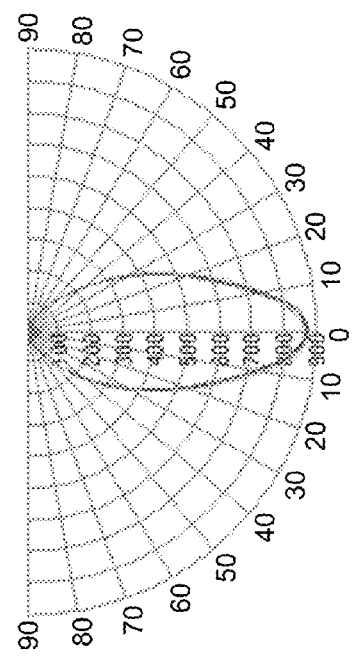

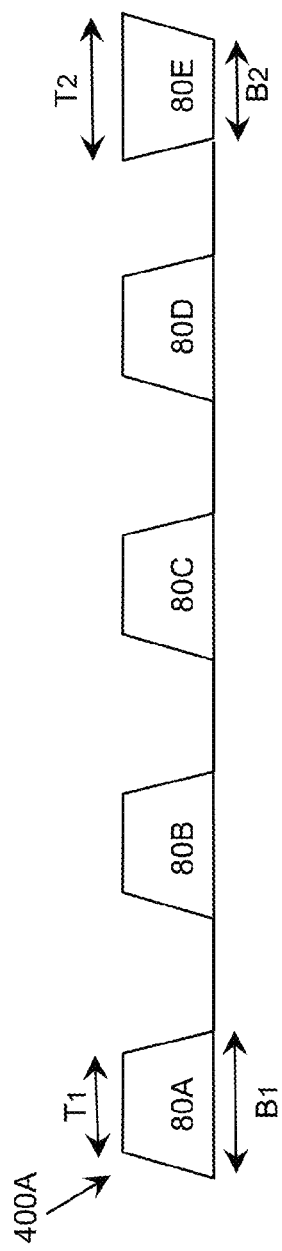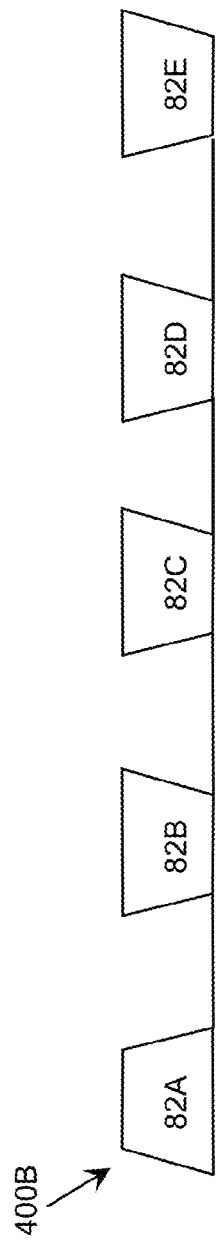

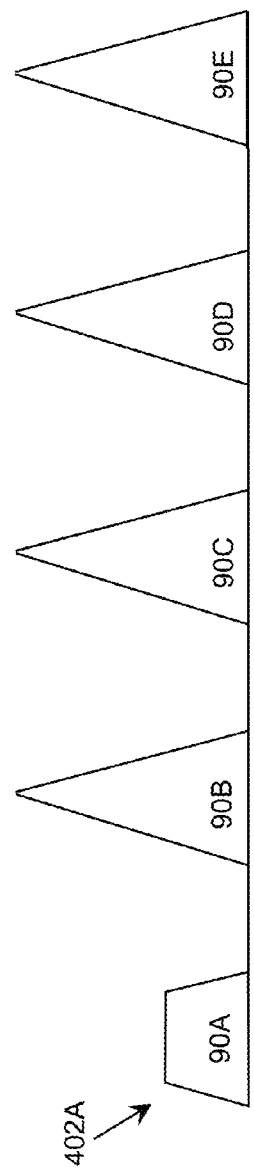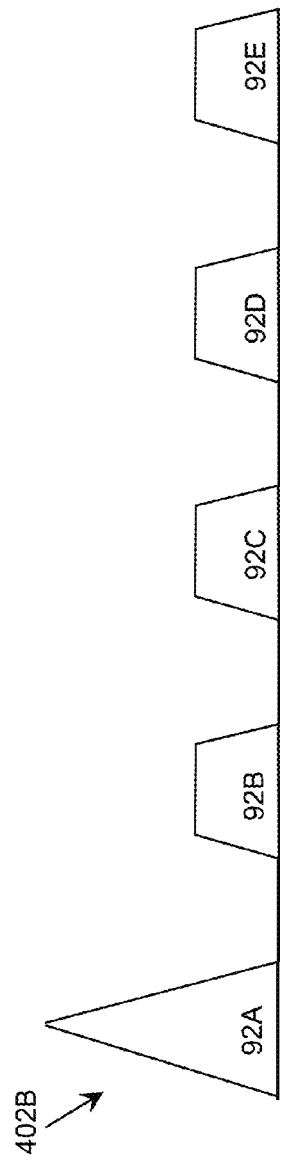

DEVICE INCLUDING TRANSPARENT LAYER WITH PROFILED SURFACE FOR IMPROVED EXTRACTION

REFERENCE TO RELATED APPLICATIONS

The current application is a continuation of U.S. application Ser. No. 14/297,656, which was filed on 6 Jun. 2014, and which is continuation-in-part of U.S. application Ser. No. 13/517,711, which was filed on 14 Jun. 2012, and which claims the benefit of U.S. Provisional Application No. 61/497,489, which was filed on 15 Jun. 2011, all of which are hereby incorporated by reference.

GOVERNMENT LICENSE RIGHTS

This invention was made with Federal government support under Contract No. W911 NF-10-2-0023 awarded by Defense Advanced Research Projects Agency (DARPA). The government has certain rights in the invention.

TECHNICAL FIELD

The disclosure relates generally to emitting devices, and more particularly, to an emitting device with improved light extraction.

BACKGROUND ART

Semiconductor emitting devices, such as light emitting diodes (LEDs) and laser diodes (LDs), include solid state emitting devices composed of group III-V semiconductors. A subset of group III-V semiconductors includes group III nitride alloys, which can include binary, ternary and quaternary alloys of indium (In), aluminum (Al), gallium (Ga), and nitrogen (N). Illustrative group III nitride based LEDs and LDs can be of the form $In_yAl_xGa_{1-x-y}N$, where x and y indicate the molar fraction of a given element, $0 \le x$, $y \le 1$, and $0 \le x+y \le 1$. Other illustrative group III nitride based LEDs and LDs are based on boron (B) nitride (BN) and can be of the form $Ga_zIn_yAl_xB_{1-x-y-z}N$, where $0 \le x$, y, $z \le 1$, and $0 \le x+y+z \le 1$.

An LED is typically composed of semiconducting layers. During operation of the LED, an applied bias across doped layers leads to injection of electrons and holes into an active layer where electron-hole recombination leads to light generation. Light is generated with uniform angular distribution and escapes the LED die by traversing semiconductor layers in all directions. Each semiconducting layer has a particular combination of molar fractions (e.g., x, y, and z) for the various elements, which influences the optical properties of the layer. In particular, the refractive index and absorption characteristics of a layer are sensitive to the molar fractions of the semiconductor alloy.

An interface between two layers is defined as a semiconductor heterojunction. At an interface, the combination of molar fractions is assumed to change by a discrete amount. A layer in which the combination of molar fractions changes continuously is said to be graded. Changes in molar fractions of semiconductor alloys can allow for band gap control, but can lead to abrupt changes in the optical properties of the materials and result in light trapping. A larger change in the index of refraction between the layers, and between the substrate and its surroundings, results in a smaller total internal reflection (TIR) angle (provided that light travels from a high refractive index material to a material with a lower refractive index). A small TIR angle results in a large fraction of light rays reflecting from the interface boundaries, thereby leading to light trapping and subsequent absorption by layers or LED metal contacts.

Roughness at an interface allows for partial alleviation of the light trapping by providing additional surfaces through which light can escape without totally internally reflecting from the interface. Nevertheless, light only can be partially transmitted through the interface, even if it does not undergo TIR, due to Fresnel losses. Fresnel losses are associated with light partially reflected at the interface for all the incident light angles. Optical properties of the materials on each side of the interface determines the magnitude of Fresnel losses, which can be a significant fraction of the transmitted light.

SUMMARY OF THE INVENTION

Aspects of the invention provide a profiled surface for improving the propagation of radiation through an interface. The profiled surface includes a set of large roughness components providing a first variation of the profiled surface having a characteristic scale approximately an order of magnitude larger than a target wavelength of the radiation. The set of large roughness components can include a series of truncated shapes. The profiled surface also includes a set of small roughness components superimposed on the set of large roughness components and providing a second variation of the profiled surface having a characteristic scale on the order of the target wavelength of the radiation.

A first aspect of the invention provides a device comprising: an at least partially transparent layer having a first side and a second side, wherein radiation enters the at least partially transparent layer through the first side and exits the at least partially transparent layer through the second side, and wherein at least one of the first side or the second side comprises a profiled surface, the profiled surface including: a set of large roughness components providing a first variation of the profiled surface having a characteristic scale approximately an order of magnitude larger than a target wavelength of the radiation, wherein the set of large roughness components comprise a series of truncated shapes; and a set of small roughness components providing a second variation of the profiled surface having a characteristic scale on the order of the target wavelength of the radiation, wherein the set of small roughness components are superimposed on the set of large roughness components.

A second aspect of the invention provides a method comprising: designing a profiled surface for an at least partially transparent layer of a device, wherein radiation passes through the profiled surface during operation of the device, wherein the profiled surface includes: a set of large roughness components providing a first non-uniform variation of the profiled surface having a characteristic scale approximately an order of magnitude larger than a target wavelength of the radiation, wherein the set of large roughness components comprise a series of truncated shapes; and a set of small roughness components providing a second non-uniform variation of the profiled surface having a characteristic scale on the order of the target wavelength of the radiation, wherein the set of small roughness components are superimposed on the set of large roughness components.

A third aspect of the invention provides an emitting device comprising: an active region configured to generate radiation having a peak wavelength; and an at least partially transparent layer on a first side of the active region, wherein radiation generated in the active region passes through the at least partially transparent layer, and wherein the at least partially transparent layer includes at least one profiled surface, wherein the at least one profiled surface includes: a set of large roughness components providing a first variation of the profiled surface having a characteristic scale approximately an order of magnitude larger than a target wavelength of the radiation, wherein the set of large roughness components comprise a series of truncated shapes; and a set of small roughness components providing a second variation of the profiled surface having a characteristic scale on the order of the target wavelength of the radiation, wherein the set of small roughness components are superimposed on the set of large roughness components.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 3 shows the effect of the small roughness component on transmission over a range of angles of incidence according to an embodiment.

FIG. 4 shows the effect of the dimensions of the small roughness component on the graded refractive index according to an embodiment.

FIGS. 7A-7C show illustrative large roughness components and a corresponding illustrative polar plot of intensity according to embodiments.

FIGS. 8A-8B show illustrative profiled surfaces according to embodiments.

FIGS. 9A-9B show illustrative profiled surfaces according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a profiled surface for improving the propagation of radiation through an interface. The profiled surface includes a set of large roughness components providing a first variation of the profiled surface having a characteristic scale approximately an order of magnitude larger than a target wavelength of the radiation. The set of large roughness components can include a series of truncated shapes. The profiled surface also includes a set of small roughness components superimposed on the set of large roughness components and providing a second variation of the profiled surface having a characteristic scale on the order of the target wavelength of the radiation. As used herein, unless otherwise noted, the term "set" means one or more (i.e., at least one) and the phrase "any solution" means any now known or later developed solution.

Figure 1:
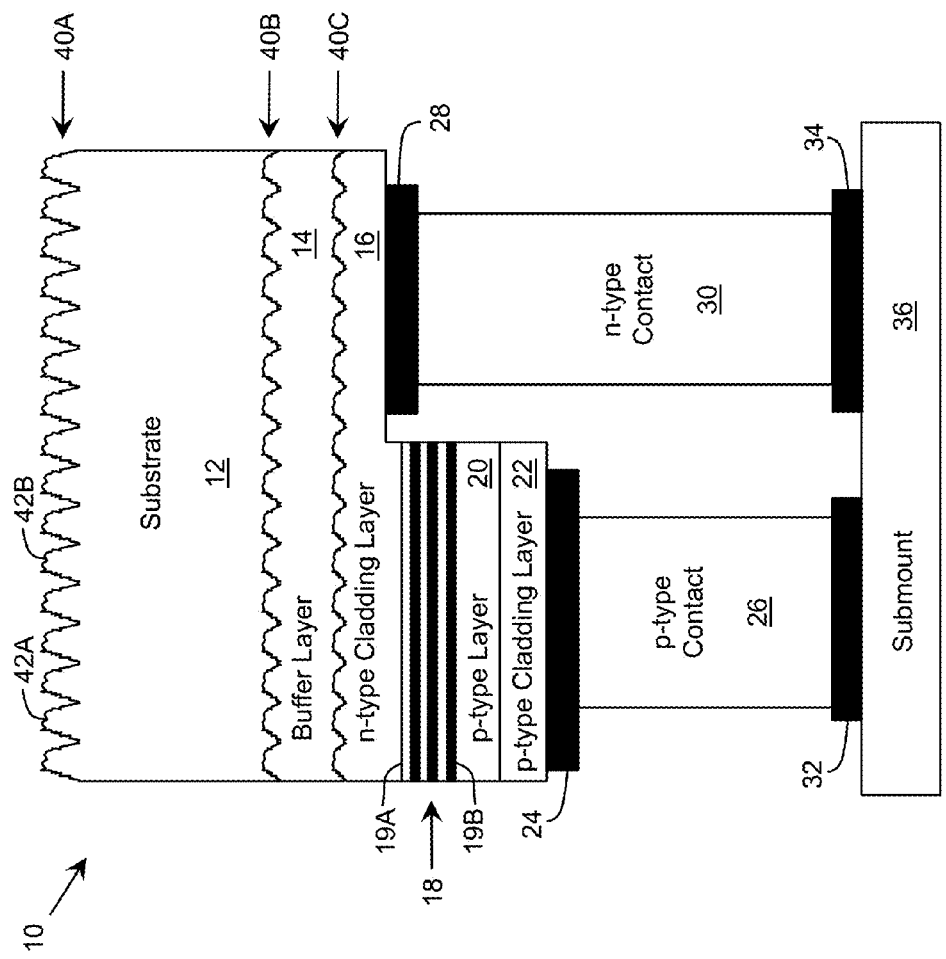
FIG. 1 shows a schematic structure of an illustrative emitting device according to an embodiment.

Turning to the drawings, FIG. 1 shows a schematic structure of an illustrative emitting device 10 according to an embodiment. In a more particular embodiment, the emitting device 10 is configured to operate as a light emitting diode (LED), such as a conventional or super luminescent LED. Alternatively, the emitting device 10 can be configured to operate as a laser diode (LD). In either case, during operation of the emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like.

The emitting device 10 includes a heterostructure comprising a substrate 12, a buffer layer 14 adjacent to the substrate 12, an n-type cladding layer 16 (e.g., an electron supply layer) adjacent to the buffer layer 14, and an active region 18 having an n-type side 19A adjacent to the n-type cladding layer 16. Furthermore, the heterostructure of the emitting device 10 includes a p-type layer 20 (e.g., an electron blocking layer) adjacent to a p-type side 19B of the active region 18 and a p-type cladding layer 22 (e.g., a hole supply layer) adjacent to the p-type layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIN_ZN$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type cladding layer 16 and the p-type layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can be sapphire, silicon carbide (SiC), silicon (Si), GaN, AlGaN, AlON, LiGaO$_2$, or another suitable material, and the buffer layer 14 can be composed of AlN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the p-type cladding layer 22 and/or the p-type contact 26 can be at least partially transparent (e.g., semi-transparent or transparent) to the electromagnetic radiation generated by the active region 18. For example, the p-type cladding layer 22 and/or the p-type contact 26 can comprise a short period superlattice lattice structure, such as an at least partially transparent magnesium (Mg)-doped AlGaN/AlGaN short period superlattice structure (SPSL). Furthermore, the p-type contact 26 and/or the n-type contact 30 can be at least partially reflective of the electromagnetic radiation generated by the active region 18. In another embodiment, the n-type cladding layer 16 and/or the n-type contact 30 can be formed of a short period superlattice, such as an AlGaN SPSL, which is at least partially transparent to the electromagnetic radiation generated by the active region 18.

As used herein, a layer is at least partially transparent when the layer allows at least a portion of electromagnetic radiation in a corresponding range of radiation wavelengths to pass there through. For example, a layer can be configured to be at least partially transparent to a range of radiation wavelengths corresponding to a peak emission wavelength for the light (such as ultraviolet light or deep ultraviolet light) emitted by the active region 18 (e.g., peak emission wavelength +/– five nanometers). As used herein, a layer is at least partially transparent to radiation if it allows more than approximately 0.5 percent of the radiation to pass there through. In a more particular embodiment, an at least partially transparent layer is configured to allow more than approximately five percent of the radiation to pass there through. Similarly, a layer is at least partially reflective when the layer reflects at least a portion of the relevant electromagnetic radiation (e.g., light having wavelengths close to the peak emission of the active region). In an embodiment, an at least partially reflective layer is configured to reflect at least approximately five percent of the radiation.

As further shown with respect to the emitting device 10, the device 10 can be mounted to a submount 36 via the contacts 26, 30. In this case, the substrate 12 is located on the top of the emitting device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the emitting device 10 can comprise a substantially uniform composition or a graded composition. For example, a layer can comprise a graded composition at a heterointerface with another layer. In an embodiment, the p-type layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the emitting device 10 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 18 and one or both of the p-type cladding layer 22 and the electron supply layer 16.

Furthermore, an emitting device/heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type cladding layer 22 and the active region 18. Similarly, a device/heterostructure can include a p-type layer located between the p-type cladding layer 22 and the active region 18. The DBR structure and/or the p-type layer can comprise any composition based on a desired wavelength of the light generated by the device/heterostructure. In one embodiment, the DBR structure comprises a Mg, Mn, Be, or Mg+Si-doped p-type composition. The p-type layer can comprise a p-type AlGaN, AlInGaN, and/or the like. It is understood that a device/heterostructure can include both the DBR structure and the p-type layer (which can be located between the DBR structure and the p-type cladding layer 22) or can include only one of the DBR structure or the p-type layer. In an embodiment, the p-type layer can be included in the device/heterostructure in place of an electron blocking layer. In another embodiment, the p-type layer can be included between the p-type cladding layer 22 and the electron blocking layer.

Regardless, as illustrated in FIG. 1, the device 10 can include one or more at least partially reflective layers on a first side of the active region 18 and one or more layers having a profiled surface 40A-40C on an opposing side of the active region 18 through which radiation generated in the active region 18 can leave the device 10. As illustrated, each profiled surface 40A-40C is configured to provide a boundary for an interface between two adjacent layers and/or an interface between the device 10 and the surrounding environment that is uneven or rough rather than substantially smooth. In an embodiment, the device 10 can include a profiled surface 40A-40C at each interface where the refractive index changes abruptly (e.g., a difference in refractive indexes greater than or equal to approximately five percent). For example, as described herein, the substrate 12 can be made of sapphire, the buffer layer 14 can be AlN, and the cladding layer 14 can be AlGaN. For an illustrative target wavelength, these materials can have indexes of refraction of 1.8, 2.3, and 2.5, respectively. To this extent, the device 10 is shown including a profiled surface 40A at the interface between the substrate 12 and the environment (which has an index of refraction of approximately one); a profiled surface 40B at the interface between the buffer layer 14 and the substrate 12; and/or a profiled surface 40C at the interface between the n-type cladding layer 16 and the buffer layer 14. In this case, the buffer layer 14 can act as a light extraction film inserted between two materials with two different refraction indexes to provide a more gradual transition of refraction indexes.

It is understood that various embodiments of the device 10 can include a profiled surface configured as described herein at any combination of one or more interfaces. To this extent, a profiled surface can be included on any type of group III-nitride based semiconductor surface, such as AlIn-GaN or AlBGaN semiconductor alloys. Furthermore, a profiled surface can be included, for example, on an ultraviolet transparent glass, a polymer with a matched index deposited over a group III-nitride based semiconductor surface, and/or the like.

Each profiled surface 40A-40C can be configured to improve the extraction of radiation from a corresponding at least partially transparent layer 12, 14, 16, respectively. For example, during operation of the device 10, radiation can be generated in the active region 18 and travel through at least partially transparent layers 16, 14, 12, before being emitted from the device 10. The profiled surfaces 40C, 40B can be configured to increase the amount of radiation that exits a first layer 16, 14 and enters an adjacent layer 14, 12, respectively, as compared to a device having substantially smooth boundaries between the layers 12, 14, 16. Similarly, the profiled surface 40A can be configured to increase the amount of radiation that exits the device 10, e.g., via substrate 12, and enters into the surrounding environment, as compared to a device having a substantially smooth outer surface.

As illustrated, a profiled surface 40A-40C can be formed using a plurality of roughness elements, such as roughness elements 42A, 42B forming a part of the profiled surface 40A. Each roughness element 42A, 42B can be configured to provide additional surfaces for reflecting and refracting light, thereby facilitating light extraction from the corresponding layer (e.g., the substrate 12). In an embodiment, a roughness element 42A, 42B is formed of a large roughness component, on which is superimposed a small roughness component as described herein. While each of the profiled surfaces 40A-40C are shown including a particular number of roughness elements 42A, 42B, each of which is configured substantially similar to the other, it is understood that each profiled surface 40A-40C can be formed of any number of roughness elements having any combination of configurations.

In an embodiment, the large roughness components of the roughness elements 42A, 42B provide variation of the profiled surface 40A having a characteristic scale greater than a target wavelength. The target wavelength can be selected based on a peak wavelength of the radiation desired to pass through the interface during operation of the device 10 and can be within any range of wavelengths, including visible light, ultraviolet radiation, deep ultraviolet radiation, infrared light, and/or the like. In an embodiment, the target wavelength corresponds to the peak wavelength of the radiation generated in the active region 18. In a more particular embodiment, the characteristic scale of the variation provided by the large roughness components is approximately an order of magnitude (e.g., ten times) larger than the target wavelength, and can be determined based on the average height and/or width of the large roughness components. In an embodiment, the large roughness components have comparable heights and widths, e.g., of approximately two to four micrometers. Inclusion of the large roughness components can reduce losses associated with TIR.

Additionally, the small roughness components of the roughness elements 42A, 42B can provide variation of the profiled surface 40A having a characteristic scale on the order of the target wavelength. To this extent, the characteristic scale of the variation provided by the small roughness components can be between approximately ten to two hundred percent of the target wavelength, and can be determined based on the average height of the small roughness components. In an embodiment, the small roughness components have heights between approximately ten to one hundred nanometers. Inclusion of the small roughness components can reduce Fresnel losses. Furthermore, the small roughness components can form a photonic crystal, which is configured to guide the radiation of a target wavelength to facilitate its extraction from the layer.

Figure 2B:
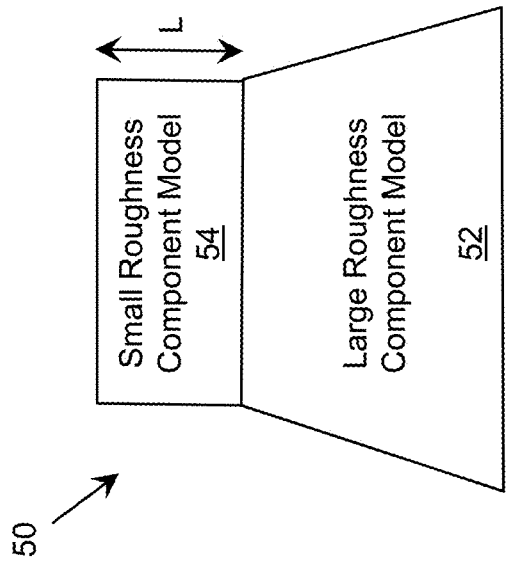
FIGS. 2A and 2B show an illustrative roughness element and an illustrative model for a roughness element, respectively, according to an embodiment.
Figure 2A:
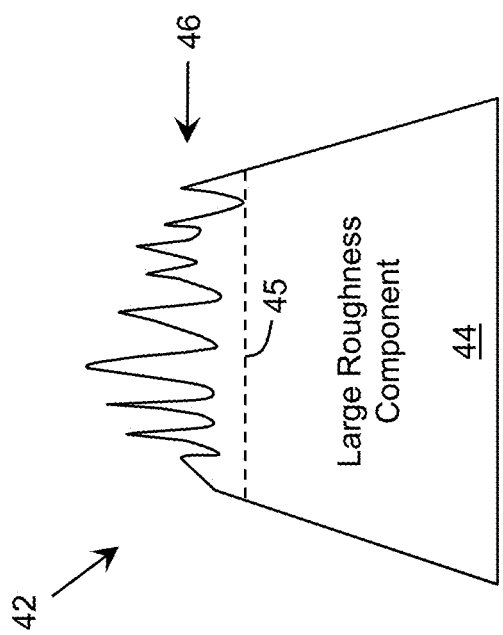

FIGS. 2A and 2B show an illustrative roughness element 42 and an illustrative roughness element model 50, respectively, according to an embodiment. As illustrated in FIG. 2A, the roughness element 42 includes a large roughness component 44 on which is superimposed a small roughness component 46. The large roughness component 44 is shown having a truncated triangular cross section, which can correspond to a truncated cone or a truncated pyramid having any number of sides. The small roughness component 46 is illustrated as a series of peaks and valleys of material having random variations in heights and locations extending from the truncated portion 45 of the large roughness component 44. The small roughness component 46 can reduce Fresnel losses. As illustrated in FIG. 2B, the roughness element model 50 can include a large roughness component model 52 and a small roughness component model 54. The large roughness component model 52 can comprise, for example, a truncated cone or a truncated pyramid shape. The small roughness component model 54 can model the small roughness component 46 as an intermediate layer having a thickness L, where the thickness corresponds to the characteristic scale of the small roughness component 46 and can be measured as the distance between the lowest valley and the highest peak on the roughness element 42.

The small roughness component 46 can introduce a graded refractive index into the roughness element 42. In particular, for a given height h along the thickness L of the intermediate layer of the small roughness component model 54, a corresponding index of refraction can be estimated by calculating an average between the refractive index of the material forming the roughness element 42 and the material adjacent to the roughness element 42 (e.g., the layer/environment into which the radiation is transmitted after exiting the roughness element 42), where the average is weighted by a fractional cross sectional area of the small roughness component 46 at the given height h.

FIG. 3 shows the effect of the small roughness component 46 (FIG. 2A) on transmission (T) over a range of angles of incidence ($\Theta$) according to an embodiment. In this case, the roughness element is included at an interface between a sapphire substrate 12 (FIG. 1) having an index of refraction n=1.825 and the surrounding air (having an index of refraction approximately equal to 1) for radiation having a given wavelength in a vacuum, $\lambda_0$. As illustrated, when the small roughness component 46 is not included (i.e., L=$0\lambda_0$), the transmission has a maximum of approximately 0.92 and begins to drop significantly when the angle of incidence exceeds approximately twenty degrees. When the small roughness component 46 has a thickness L of approximately $0.25\lambda_0$, the maximum transmission increases to approximately 0.98 and is maintained until the angle of incidence exceeds approximately twenty-eight degrees. When the small roughness component 46 has a thickness L between approximately $0.5\lambda_0$ to $1\lambda_0$ or greater, the transmission exceeds 0.99 until the angle of incidence exceeds approximately twenty-eight degrees. As a result, the small roughness component 46 can reduce the Fresnel losses, which results in higher radiation extraction from the sapphire substrate 12 as compared to an interface without the small roughness component 46.

FIG. 4 shows the effect of the dimensions of the small roughness component 46 on the graded refractive index according to an embodiment. As illustrated, the graded refractive index gradually transitions from the refractive index of the material of the small roughness component 46 (e.g., sapphire) to the refractive index of the adjacent material (e.g., air) as the distance, z, from the large roughness component 44 (FIG. 2A) increases.

Figure 5B:
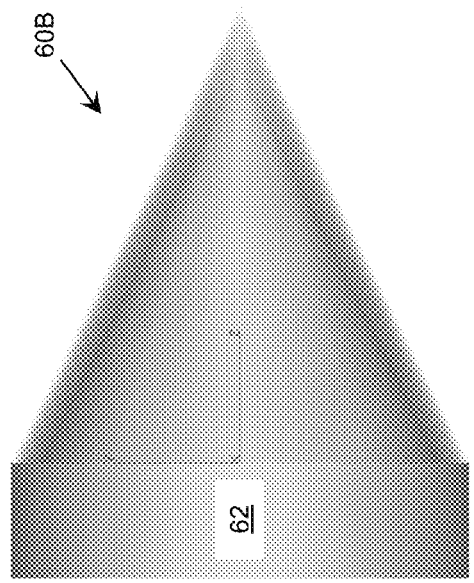
FIGS. 5A and 5B show illustrative schematics of roughness elements with a constant index of refraction and a graded index of refraction, respectively, according to an embodiment.
Figure 5A:
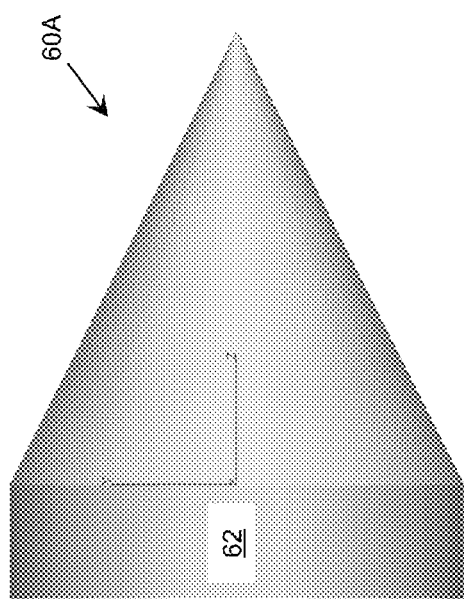

FIGS. 5A and 5B show illustrative schematics of roughness elements 60A, 60B with a constant index of refraction and a graded index of refraction, respectively, according to an embodiment. In each case, a light emitting source is located at a base of the cone in the rightmost surface of the adjoining cylinder 62. The walls of the cylinder 62 are set to be partially absorbing mirrors to mimic absorption of light in a typical light emitting diode. The roughness element 60A comprises a cone shape with smooth sides. In contrast, the roughness element 60B comprises a cone shape (e.g., a large roughness component) with sides having small roughness components superimposed thereon. As a result, the sides of the roughness element 60B have a fuzzy look as compared to the sides of the roughness element 60A.

Figure 6B:
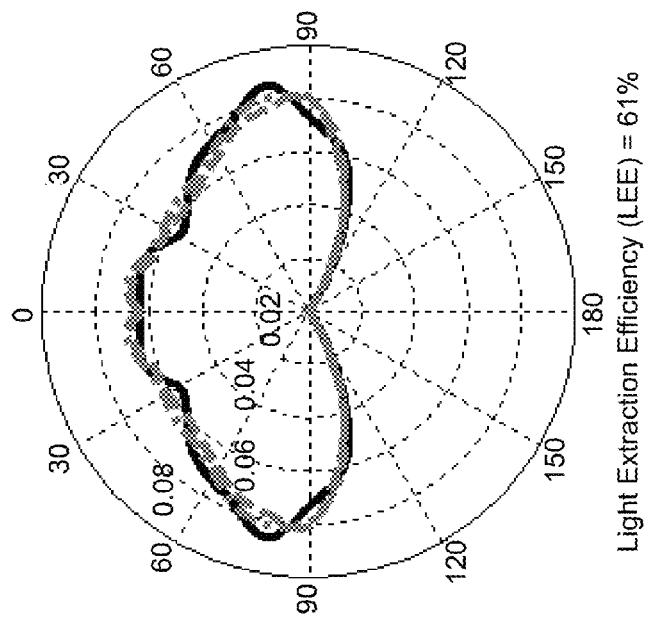
FIGS. 6A and 6B show illustrative distributions of light and the corresponding light extraction efficiencies (LEE) for a constant index of refraction cone and a graded index of refraction cone, respectively, according to an embodiment.
Figure 6A:
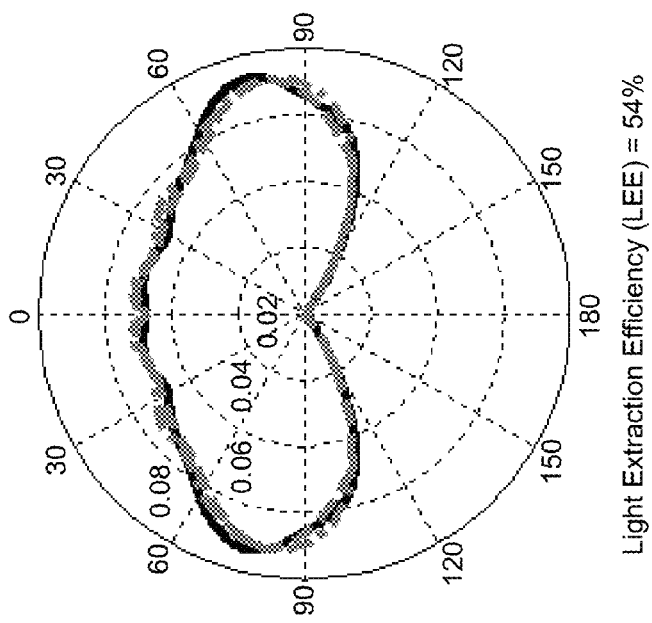

FIGS. 6A and 6B show illustrative distributions of light and the corresponding light extraction efficiencies (LEE) for the cones 60A, 60B of FIGS. 5A and 5B, respectively, according to an embodiment. As illustrated, the LEE (shown in FIG. 6B) for the transmission of light through the cone 60B having a graded index of refraction is clearly higher than the LEE (shown in FIG. 6A) for the transmission of light through the cone 60A having a constant index of refraction, e.g., an improvement of over ten percent.

FIGS. 7A-7C show illustrative large roughness components 70A, 70B and a corresponding illustrative polar plot of intensity, respectively, according to embodiments. In FIG. 7A, the large roughness component 70A is in the shape of a truncated cone, while the large roughness component 70B of FIG. 7B is in the shape of a truncated pyramid. Each large roughness component 70A, 70B can comprise an inverse truncated element, where the base B, which is the portion of the large roughness component 70A, 70B adjacent to the corresponding layer (e.g., substrate 12), is smaller than the top T. While not shown, it is understood that each large roughness component 70A, 70B can be used to form a roughness element by superimposing a small roughness component on, for example, the top surface of the truncated shape. Furthermore, while the truncated pyramid of the large roughness component 70B is shown having a base and top with four sides, it is understood that the base and top of the pyramid can be a polygon with any number of sides.

Such a configuration for the large roughness components 70A, 70B can be used, for example, for light focusing in order to facilitate extraction of light from the layer, e.g., by designing the large roughness components 70A, 70B to determine an emission cone angle for radiation of the target wavelength. To this extent, the sides of the truncated cone shape of the large roughness component 70A can form an angle $\Theta$ of less than ninety degrees. Similarly, the sides of the truncated pyramid shape of the large roughness component 70B and the sides of the truncated cone shape of the large roughness component 44A can form an angle with respect to the normal of less than forty-five degrees. In this manner, an increased amount of light reflections will result in the light being directed out from the layer. FIG. 7C shows an illustrative polar plot of intensity distribution for the large roughness component 70A.

FIGS. 8A-8B show illustrative profiled surfaces 400A, 400B according to embodiments. In each case, it is understood that while only the set of large roughness components of each profiled surface 400A, 400B are shown for clarity, each profiled surface 400A, 400B can include a set of small roughness components (e.g., the set of small roughness components 46 in FIG. 2A) superimposed on the set of large roughness components as described herein. As illustrated in the figures and described herein, the set of large roughness components can include a series of truncated shapes.

In FIG. 8A, the profiled surface 400A includes a set of large roughness components 80A-80E. A first portion of the set of large roughness components (e.g., components 80A-80D) includes a series of truncated triangular cross sections, each of which can correspond to a truncated cone or a truncated pyramid having any number of sides. A second portion of the set of large roughness components (e.g., component 80E) includes one or more inverse truncated triangular cross sections. For example, the large roughness components 80A-80D each include a base $B_1$ that is larger than a top $T_1$. The base $B_1$ is the portion of the large roughness component 80A-80D that is adjacent to the corresponding layer (e.g., substrate 12), and is smaller than the top $T_1$. Conversely, the inverse truncated large roughness component 80E includes a base $B_2$ that is smaller than a top $T_2$. In FIG. 8B, the profiled surface 400B includes a first portion of the set of large roughness components including one or more truncated components (e.g., component 82A) and a second portion of the set of large roughness components including a series of inverse truncated large roughness components (e.g., components 82B-82E). It is understood that the profiled surfaces 400A, 400B can include any number of truncated large roughness components and any number of inverse truncated large roughness components. In an embodiment, the truncated large roughness components can be at least approximately twenty percent of the large roughness components located on the profiled surface. In another embodiment, the inverse truncated large roughness components can be at least approximately twenty percent of the large roughness components located on the profiled surface.

FIGS. 9A-9B show illustrative profiled surfaces 402A, 402B according to embodiments. In each case, it is understood that while only the set of large roughness components of each profiled surfaces 402A, 402B are shown for clarity, each profiled surface 402A, 402B can include a set of small roughness components (e.g., the set of small roughness components 46 in FIG. 2A) superimposed on the set of large roughness components as described herein. As illustrated in the figures and described herein, the set of large roughness components can concurrently include a series of truncated shapes and a series of non-truncated shapes. This configuration can be useful, for example, as a parameter for light scattering.

In FIG. 9A, the profiled surface 402A includes a set of large roughness components 90A-90E. A first portion of the set of large roughness components (e.g., component 90A) includes one or more components having truncated triangular cross sections, which can correspond to a truncated cone or a truncated pyramid having any number of sides. A second portion of the set of large roughness components (e.g., 90B-90E) includes components having non-truncated triangular cross sections. In FIG. 9B, the profiled surface 402B includes a first portion of the set of large roughness components including one or more non-truncated large roughness components (e.g., component 92A) and a second portion of the set of large roughness components including truncated large roughness components (e.g., components 92B-92E). It is understood that the profiled surfaces 402A, 402B can include any number of truncated large roughness components and any number of non-truncated large roughness components. In an embodiment, for example, the truncated large roughness components can be at least approximately twenty percent of the large roughness components located on the profiled surface. In another embodiment, for example, the non-truncated large roughness components can be at least approximately twenty percent of the large roughness components located on the profiled surface.

In each case shown in FIGS. 8A-8B and 9A-9B, the first portion of the set of large roughness components (e.g., components 80A-80D in FIG. 8A) can be interspersed with the second portion of the set of large roughness components (e.g., component 80E in FIG. 8A) on the profiled surface in any one or two dimensional pattern. Although the first portion of the set of large roughness components in FIGS. 8A-8B are shown as grouped together, it is understood that the first and the second portion of the set of large roughness components can be anywhere along the profiled surface and are not necessarily grouped together. For example, in FIG. 8A, component 80E can be placed between component 80A and component 80B, between component 80B and component 80C; between component 80C and component 80D, and/or the like. Furthermore, if more than one component is in both the first portion and the second portion of the set of large roughness components, it is understood that the first portion and the second portion can be interspersed in any regular, semi-regular, or random pattern. To this extent, the first portion and the second portion of the set of large roughness components can form an alternating pattern of large roughness components.

In one embodiment, the large roughness components or large truncated roughness components (herein referred to as large components or large elements) may be collocated in a different portion of the profiled surface than a portion of the profiled surface on which the inverse truncated large roughness elements (herein referred to as inverse components or elements) are located. Such a configuration can be utilized, e.g., in order to affect the distribution of intensity of radiation emitted from the corresponding device (e.g., a UV LED). For example, the large elements may be collocated in a centrally located (e.g., middle) portion of an exit face of the LED device, occupying approximately 20-50% of the surface area of the exit face, and the inverse components can surround the region containing large elements. It is understood that other collocations of large elements and inverse elements are possible. One approach for designing a collocation pattern uses ray tracing simulation and an optimization algorithm to obtain a target distribution of intensity of radiation emitted from the device. Such a process can be roughly understood as a series of steps, where in order to obtain or approximate a target intensity distribution over polar angles, the collocation pattern is adjusted until a local or global optimum condition corresponding to the target intensity distribution is found. It is further understood that in order to optimize the intensity distribution over polar angles with respect to a target intensity distribution, as well as an overall efficiency of the device, not only collocation of large and inverted components can be varied, but also the collocation of elements containing small roughness scale. For example, the large elements positioned in the central portion of the exit face may contain small scale roughness elements, whereas the inverse elements may not contain such small scale roughness elements.

Returning to FIG. 1, it is understood that a device 10, or a heterostructure used in forming a device 10, including one or more layers having a profiled surface, such as layers 12, 14, and 16, can be fabricated using any solution. For example, an emitting device/heterostructure can be manufactured by obtaining (e.g., forming, preparing, acquiring, and/or the like) a substrate 12, forming (e.g., growing, depositing, adhering, and/or the like) a buffer layer 14 thereon, and forming an n-type cladding layer 16 over the buffer layer 14. Furthermore, the active region 18, e.g., including quantum wells and barriers, can be formed over the n-type cladding layer 16 using any solution. The p-type layer 20 can be formed over the active region 18 and the p-type cladding layer 22 can be formed on the p-type layer 20 using any solution. Additionally, one or more metal layers, contacts, and/or additional layers can be formed using any solution. Furthermore, the heterostructure/device can be attached to a submount via contact pads.

It is understood that the fabrication of the emitting device/heterostructure can include the deposition and removal of a temporary layer, such as mask layer, the patterning one or more layers, the formation of one or more additional layers not shown, and/or the like. To this extent, a profiled surface 40A-40C (or profiled surfaces 400A, 400B, 402A, 402B) can be fabricated using any combination of deposition and/or etching. For example, the fabrication can include selective deposition and/or etching of nanoscale objects, such as nanodots and/or nanorods, of the material to form the large and/or small roughness components. Such deposition and/or etching can be used to form periodic and/or non-periodic random patterns.

In fabricating the profiled surfaces discussed herein, a simulation using ray tracing and an optimization algorithm, such as a genetic algorithm, can be performed. An illustrative embodiment of the process of simulation can comprise:
a) Modeling an optical structure of a light emitting diode (LED), which can include incorporating domains with their respective optical properties and assigning volumes or surfaces for emission of light;
b) Evaluating an efficiency of the LED and intensity of radiated light by collecting emitted rays on the surface of a control detecting sphere surrounding the LED;
c) Incorporating a set of roughness elements on a set of LED surfaces as described herein;
d) Establishing a set of optimization parameters for modeling roughness, such as roughness shape, size, location, reflective/transmittal properties of roughness surfaces (which model the reflective/transparent properties of such roughness in the presence of small sub-wavelength roughness elements), and/or the like; and
e) Re-evaluating the efficiency of LED by varying optimization parameters describing roughness where the variation of any one parameter in the set of parameters can be either random, or continuous (wherein continuous variation includes also no variation). The parameter variation can be performed, for example, according to a genetic algorithm where models with sets of improved parameters are allowed to "cross-breed", wherein "cross-breeding" includes overlapping a parameter space of one model with a parameter space of another model in various combinations to create one or more new sets of optimization parameters for evaluation. Furthermore, the "cross-breeding" can include introducing randomness into one or more parameters of the new sets of optimization parameters.

While shown and described herein as a method of designing and/or fabricating an emitting device to improve extraction of light from the device, it is understood that aspects of the invention further provide various alternative embodiments. For example, aspects of the invention can be implemented to facilitate the transmission of light within the device, e.g., as part of optical pumping of a laser light generating structure, excitation of a carrier gas using a laser pulse, and/or the like. Similarly, an embodiment of the invention can be implemented in conjunction with a sensing device, such as a photosensor or a photodetector. In each case, a profiled surface can be included in an exterior surface of the device and/or an interface of two adjacent layers of the device in order to facilitate the transmission of light through the interface in a desired direction.

Figure 10:
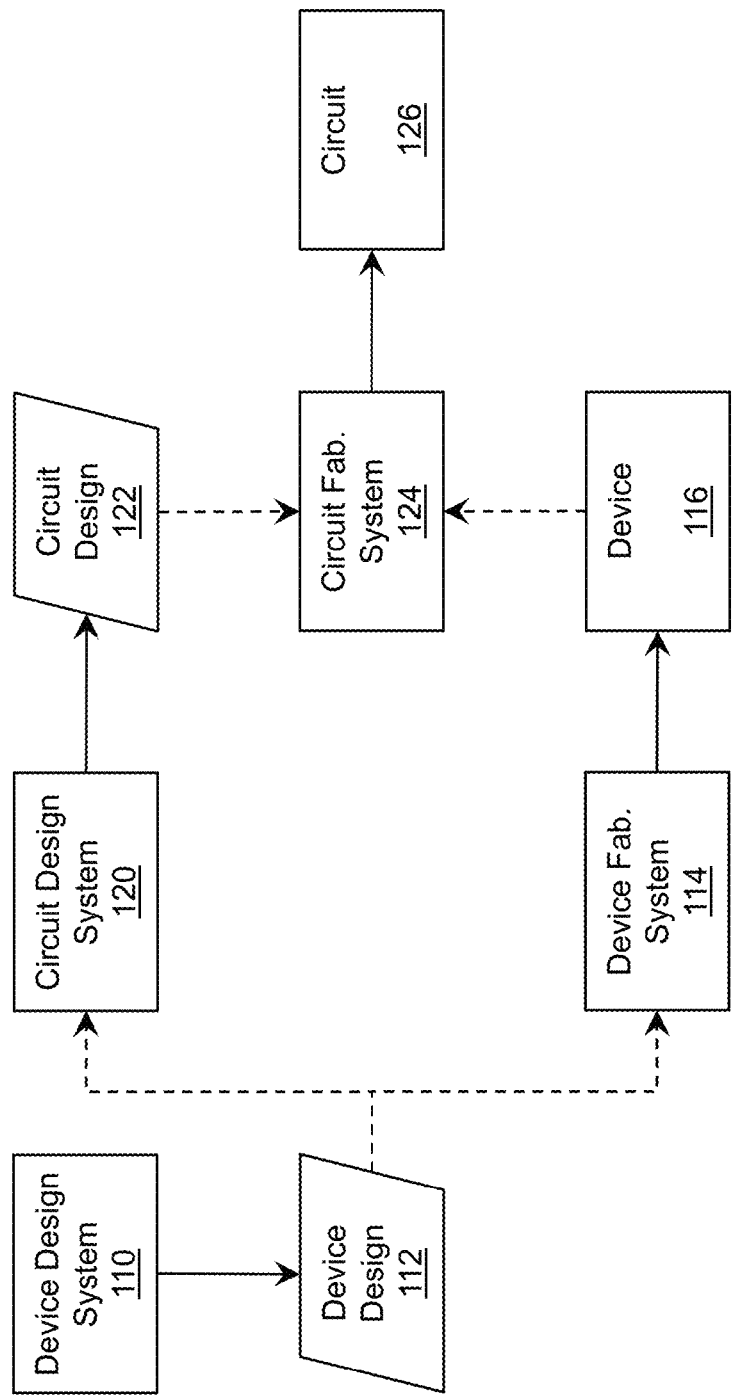
FIG. 10 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 10 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
   an at least partially transparent layer having a first side and a second side, wherein radiation enters the at least partially transparent layer through the first side and exits the at least partially transparent layer through the second side, and wherein at least one of the first side or the second side comprises a profiled surface, the profiled surface including:
   a set of large roughness components providing a first variation of the profiled surface having a characteristic scale approximately an order of magnitude larger than a target wavelength of the radiation, wherein the set of large roughness components comprise a series of truncated shapes, wherein a first portion of the series of truncated shapes is inversely truncated and a second portion of the series of truncated shapes is not inversely truncated; and
   a set of small roughness components providing a second variation of the profiled surface having a characteristic scale on the order of the target wavelength of the radiation, wherein the set of small roughness components are superimposed on the set of large roughness components, and wherein the characteristic scale for the set of large roughness components and the characteristic scale for the set of small roughness components are selected to increase a transmission of radiation exiting the at least partially transparent layer by at least 5% as compared to a comparable at least partially transparent layer having a surface without the set of small roughness components.

2. The device of claim 1, wherein the partially transparent layer comprises sapphire.

3. The device of claim 1, wherein each of the first portion and the second portion occupies at least twenty percent of a lateral area of the profiled surface.

4. The device of claim 1, wherein the target wavelength of the radiation is between 250 nanometers and 350 nanometers.

5. The device of claim 1, wherein the characteristic scale for the set of large roughness components and the characteristic scale for the set of small roughness components are selected to provide a transmission of at least 93% for the radiation exiting the at least partially transparent layer.

6. The device of claim 1, wherein the set of large roughness components further comprises a series of non-truncated shapes interspersed with the series of truncated shapes.

7. The device of claim 6, wherein each of the series of non-truncated shapes and the series of truncated shapes occupies at least twenty percent of a lateral area of the profiled surface.

8. The device of claim 1, wherein the set of small roughness components are oriented normal to a surface of the set of large roughness components.

9. A method comprising:
designing a profiled surface for an at least partially transparent layer of a device, wherein radiation passes through the profiled surface during operation of the device, wherein the profiled surface includes:
a set of large roughness components providing a first non-uniform variation of the profiled surface having a characteristic scale approximately an order of magnitude larger than a target wavelength of the radiation, wherein the set of large roughness components comprise a series of truncated shapes, wherein a first portion of the series of truncated shapes is inversely truncated and a second portion of the series of truncated shapes is not inversely truncated; and
a set of small roughness components providing a second non-uniform variation of the profiled surface having a characteristic scale on the order of the target wavelength of the radiation, wherein the set of small roughness components are superimposed on the set of large roughness components, and wherein the characteristic scale for the set of large roughness components and the characteristic scale for the set of small roughness components are selected to increase a transmission of radiation exiting the at least partially transparent layer by at least 5% as compared to a comparable at least partially transparent layer having a surface without the set of small roughness components.

10. The method of claim 9, further comprising fabricating the device including the at least partially transparent layer, wherein the fabricating includes fabricating the profiled surface.

11. The method of claim 10, wherein the fabricating the profiled surface includes forming at least one of: the set of large roughness components or the set of small roughness components using at least one of: selective deposition or selective etching of nanodots.

12. The method of claim 10, wherein fabricating the profiled surface includes performing a simulation using ray tracing and a genetic algorithm.

13. An emitting device comprising:
an active region configured to generate radiation having a peak wavelength; and
an at least partially transparent layer on a first side of the active region, wherein radiation generated in the active region passes through the at least partially transparent layer, and wherein the at least partially transparent layer includes at least one profiled surface, wherein the at least one profiled surface includes:
a set of large roughness components providing a first variation of the profiled surface having a characteristic scale approximately an order of magnitude larger than a target wavelength of the radiation, wherein the set of large roughness components comprise a series of truncated shapes, wherein a first portion of the series of truncated shapes is inversely truncated and a second portion of the series of truncated shapes is not inversely truncated; and
a set of small roughness components providing a second variation of the profiled surface having a characteristic scale on the order of the target wavelength of the radiation, wherein the set of small roughness components are superimposed on the set of large roughness components, and wherein the characteristic scale for the set of large roughness components and the characteristic scale for the set of small roughness components are selected to increase a transmission of radiation exiting the at least partially transparent layer by at least 5% as compared to a comparable at least partially transparent layer having a surface without the set of small roughness components.

14. The device of claim 13, wherein the partially transparent layer comprises sapphire.

15. The device of claim 13, wherein the set of small roughness components form a photonic crystal.

16. The device of claim 13, wherein each of the first portion and the second portion occupies at least twenty percent of a lateral area of the profiled surface.

17. The device of claim 13, wherein the set of large roughness components further comprises a series of non-truncated shapes interspersed with the series of truncated shapes.

18. The device of claim 17, wherein each of the series of non-truncated shapes and the series of truncated shapes occupies at least twenty percent of a lateral area of the profiled surface.

19. The device of claim 13, wherein the characteristic scale for the set of large roughness components and the characteristic scale for the set of small roughness components are selected to provide a transmission of at least 93% for the radiation exiting the at least partially transparent layer.

20. The device of claim 13, wherein the set of small roughness components are oriented normal to a surface of the set of large roughness components.

* * * * *